(12) United States Patent
Tidhar (10) Patent No.: US 9,800,802 B2
(45) Date of Patent: Oct. 24, 2017

(54) NIGHT VISION SYSTEM AND METHOD

(75) Inventor: Gil Tidhar, Modiin (IL)

(73) Assignee: ELTA SYSTEMS LTD., Ashdod (IL)

(*) Notice: Subject to any disclaimer, the term of this patent is extended or adjusted under 35 U.S.C. 154(b) by 618 days.

(21) Appl. No.: 14/112,399

(22) PCT Filed: Apr. 17, 2012

(86) PCT No.: PCT/IL2012/050141
§ 371 (c)(1),
(2), (4) Date: Oct. 17, 2013

(87) PCT Pub. No.: WO2012/143927
PCT Pub. Date: Oct. 26, 2012

(65) Prior Publication Data
US 2014/0043489 A1    Feb. 13, 2014

(30) Foreign Application Priority Data
Apr. 17, 2011    (IL) .......................................... 212401

(51) Int. Cl.
H04N 5/33        (2006.01)
H01L 27/146     (2006.01)

(52) U.S. Cl.
CPC ........... *H04N 5/33* (2013.01); *H01L 27/1465* (2013.01); *H01L 27/14652* (2013.01); *H04N 5/332* (2013.01)

(58) Field of Classification Search
CPC .. H04N 5/33; H04N 5/332; H04N 3/09; G01J 5/02; G01J 2005/0077
USPC ...................................................... 348/164
See application file for complete search history.

(56) References Cited

U.S. PATENT DOCUMENTS

| 5,300,780 | A | 4/1994 | Denney |
| 5,818,052 | A | 10/1998 | Elabd |
| 7,652,252 | B1* | 1/2010 | Rajavel ................. G01J 3/2803 250/338.4 |
| 2005/0082520 | A1 | 4/2005 | Fathimulla et al. |
| 2005/0184308 | A1 | 8/2005 | Dutta et al. |

(Continued)

FOREIGN PATENT DOCUMENTS

| WO | 0054217 A2 | 9/2000 |
| WO | WO 0054217 * | 9/2000 |

(Continued)

*Primary Examiner* — William C Vaughn, Jr.
*Assistant Examiner* — Daniel Tekle
(74) *Attorney, Agent, or Firm* — Browdy and Neimark, PLLC (57) ABSTRACT

A night vision system and method for imaging an object at or near room temperature and in the wavelength region up to 2.5 microns is described. The includes a photodetector having a cut-off wavelength of 2.5 microns under the room temperature, an optical system configured for collecting light and focusing the collected light onto the photodetector, and a spectral filter located in an optical path of light propagating toward the photodetector. The spectral filter is configured and operable to selectively filter out light of wavelength shorter than a predetermined value, thereby gradually shifting operation of the night vision system from mostly reflection mode to a combined reflection and thermal mode, to allow the night vision system to detect light reflected from and emitted by the object being imaged.

22 Claims, 5 Drawing Sheets

(56) References Cited

U.S. PATENT DOCUMENTS

2009/0045395 A1  2/2009  Kim et al.
2010/0155910 A1  6/2010  Gaebler
2012/0102808 A1* 5/2012  Matthews ................ F41G 1/30
                                              42/113

FOREIGN PATENT DOCUMENTS

WO   WO 2008127297    * 10/2008
WO      2008127297 A2   2/2009

* cited by examiner

NIGHT VISION SYSTEM AND METHOD

FIELD OF THE INVENTION

This invention relates to systems and methods for extended thermal imaging, and more particularly to systems and methods for short wave Infrared (SWIR) imaging.

BACKGROUND OF THE INVENTION

Infrared detectors are widely used for collecting image information under conditions which do not allow regular optical observation, such as at night or through clouds, haze or dust. For example night vision detectors allow car drivers to watch beyond the reach of the car headlamps illumination field, for search and rescue operations and other applications.

Traditionally the infrared band is divided to Near IR (NIR) between 0.75 μm and 1.1 μm, Short Wavelength IR-1 (SWIR-1) optical band about 1.1 μm-1.7 μm, and Short Wavelength IR-2 (SWIR-2) optical band about 1.7 μm-2.5 μm, Mid Wave IR (MWIR) between 3 μm and 5 μm and Long wave IR (LWIR) between 8 μm and 14 μm.

SWIR detectors are used for various civilian and military applications including night vision, Silicon wafer inspection, laser beam monitoring, gas monitoring and other. Detection in the 1 μm-2.5 μm spectral range is usually implemented using detectors cooled (to cryogenic or non-cryogenic temperatures (such as photovoltaic (PV) detectors) and un-cooled detectors (such as bolometric detectors, photoconductor detectors, etc.). As known in the art, cooling the detector increases the system size, weight, cost and power consumption of the system. Therefore, cooled detectors are not a viable solution when these resources are limited. On the other hand, conventional un-cooled detectors have insufficient sensitivity and dark/background current, which are insufficient for night vision in the 1-2.5 μm spectral range.

Passive Night vision devices are usually categorized as either "reflective" (e.g.—utilizing light emitted by a natural or environmental source such as the moon, starlight, airglow or zodiacal light, urban ambient background illumination and reflected off the surface of the imaged objects and their background), or "radiative" (or "thermal") that utilize optical radiance emitted by the imaged objects themselves and emitted by their background).

Imaging means belonging to the category of reflective devices include, for example imagers working in the visible and NIR bands, e.g., SLS (Star-Light-Scope), NVG (Night Vision Goggles), ICCD (Intensified CCD), EMCCD, EBCCD, and also imagers sensitive to visible through SWIR-1 bands (Germanium-CMOS, InGaAs PV FPA, Se-based Vidicons, "Black Silicon").

Imaging means belonging to the category of "radiative" or "thermal" include, for example, Cryogenically cooled PV focal plane arrays (FPAs) based on Mercury cadmium telluride (MCT) or InSb material alloys, as well as uncooled FPAs based on bolometric, thermo-electric or piezoelectric effects.

These types of imaging techniques have several disadvantages, such that neither one of them is considered superior in all respects and all scenarios.

General Description

There is a need in the art for, and it would be useful to have, a novel SWIR imager that can operate at or near room temperature with long cut-off wavelengths that extended from 1.7 μm (for InP lattice matched InGaAs) to beyond 2.0 μm. It is believed that such SWIR imagers can be implemented by using strained InGaAs epitaxial growth on InP substrate, or MCT.

Passive night vision in the SWIR band requires very low dark current levels (noise), whereas the dark current increases as the cutoff wavelength increases. In order to allow for close to room temperature operation of a SWIR detector, and more significantly with extended wavelength SWIR, the dark current of the device must be limited. High dark current causes deterioration of the signal to noise ratio of the device, it increases the residual non uniformity of detector array and it reduces the dynamic range of the system due to integration capacitor flooding.

It would be advantageous to have super-lattice (MQW) structured P-i-N PD pixels that may be implemented in a 2D FPA, operating near zero voltage bias, to implement a dual-mode (reflective/refractive) night vision imaging means.

It would still be advantageous to have imaging means optics operating in such a manner that the mostly reflective information (in the SWIR-1 sub-band) or the mostly thermal information (in the sWIR-2 sub-band) would have different focal planes and thus could be taken in and out of focus by the user, thereby creating a picture which is mostly reflective or mostly thermal, as desired.

It would yet be advantageous to have a spectral band filter located in an optical path of light propagating to the detector operating in such a manner that the mostly reflective information (in the SWIR-1 sub-band) or the mostly thermal information (in the sWIR-2 sub-band) will be separated from each other, thereby creating a picture which is mostly reflective or mostly thermal, as desired.

The present invention partially eliminates disadvantages of the conventional SWIR imagers and provides a new night vision system which enables operation at or near room temperature and operating in the wavelength region up to 2.5 microns. The night vision system comprises an optical system for collecting light and focusing collected light onto a photodetector. The night vision system includes a photodetector having a cut-off wavelength of 2.5 microns under the room temperature conditions. The night vision system also includes an optical system configured for collecting light and focusing the collected light onto the photodetector, and a spectral filter located in an optical path of light propagating toward the photodetector. The spectral filter is configured and operable to selectively filter out light of wavelength shorter than a predetermined value. According to an embodiment, the predetermined value of the light wavelength shorter than which is filter out is about 1.8 microns. This feature enables the night vision system gradually shift operation from mostly reflection mode to a combined reflection and thermal mode, thereby allowing the night vision system to detect light reflected from and emitted by the object being imaged.

According to an embodiment, the photodetector is an extended SWIR sensor having a p-i-n structure.

According to an embodiment, the photodetector is a detection array comprising a doped InP substrate layer and a photodiode structure supported by the substrate InP layer. The said photodiode structure comprises an n-type layer, a p-type layer, and an absorption layer being sensitive to light, and located between the n and the p layers.

According to an embodiment, the n-type layer is Si-doped InGaAs buffer layer deposited on the InP substrate layer; wherein the n-type layer is undoped InGaAs cap layer; and wherein the absorption layer is undoped InGaAs.

According to one embodiment, the absorption layers is a Strained Super Lattice (SLS) layer including 250 pair InGaAs(5 nm)/GaAsSb(5 nm) multi quantum well structures.

According to another embodiment, the absorption layers is a Strained Super Lattice (SLS) layer including three superlattice layers SL1, SL2 and SL3 grown on the InP substrate layer. The SL1 superlattice layer includes: 500 periods of $In_{0.53}Al_{0.47}As$ forming the cladding, 1500 periods of $In_{0.52}Al_{0.48}As$ forming the multiplication, 110 periods of $In_{0.52}Al_{0.48}As$ forming the charging sheet, 50 periods of InAlGaAs forming the grading. The SL2 superlattice layer includes: 50 periods of $In_{0.53}Ga_{0.47}As$ and 1500 periods of 5 mm $In_{0.53}Ga_{0.47}As$/5 mm $GaAs_{0.51}Sb_{0.40}$ forming the absorber. The SL3 superlattice layer includes: 45 periods of $In_{0.53}Ga_{0.47}As$ and 500 periods of $In_{0.53}Ga_{0.47}As$ forming the cladding and 20 periods of $In_{0.53}Ga_{0.47}As$ forming a contact.

According to one embodiment, the spectral filter is arranged upstream of the optical system.

According to another embodiment, the spectral filter is arranged downstream of the optical system.

According to an embodiment, the optical system has a first optical path through which a first wavelength light generated by a thermal source is transmitted, and a second optical path through which a second wavelength environmental light reflected from objects is transmitted. The optical system is configured to modify optical characteristics of the light transmitted through the first and second paths such that the light transmitted through the first path do not interfere with light transmitted through the second paths.

According to another general aspect of the invention, a night vision method is provided for imaging an object at or near room temperature and operating in the wavelength region up to 2.5 microns. The method comprises collecting light and focusing the collected light by an optical system onto a photodetector having a cut-off wavelength of 2.5 microns under the room temperature; and selectively filtering out light of wavelength shorter than a predetermined value, thereby gradually shifting imaging from mostly reflection mode to a combined reflection and thermal mode. This feature allows detecting light reflected from and emitted by the object being imaged.

According to one embodiment, the predetermined value of the light wavelength shorter than the wavelength which is filtered out is about 1.8 microns.

According to an embodiment, a cut-off wavelength of an imaging component is selected to modify the ratio between the sensitivity of the imager to light generated by a thermal source and the sensitivity of the imager to light that originates in background light that is being offset from detected objects.

According to an embodiment, the system is configured such that a noise level of the system is low enough so that the system is sensitive to the thermal radiation emitted from the object being imaged within the wavelength range of the photodetector even in the absence of light reflections.

According to an embodiment, the optical detection may be used for detecting firing of firearms.

According to an embodiment, the optical detection may be is used for a night vision system.

According to an embodiment, the absorption layer may include more than 1,000 superlattice layers.

According to an embodiment, the detection array may operate at temperature higher than 270K.

According to an embodiment, the new night vision system includes a spectral filter located in an optical path of light propagating to the detector. The spectral filter may include or be combined with lens for directing light onto the detector. The spectral filter is configured for changing the ratio between the sensitivity of the imager to light generated by a thermal source and the sensitivity of the imager to light that originates in background light that is being offset from detected objects. According to an embodiment, the spectral filter is configured and operable to selectively filter out light of wavelength shorter than about 1.8 microns thereby shifting the system operation from "mostly reflection" mode to "reflection plus thermal" mode. According to an embodiment, wavelengths the correspond to light generated by a thermal source are transmitted along a first optical path in which, whereas wavelengths that correspond to environmental light reflected from objects are transmitted along a second optical path in which. Optics is arranged along at least one of the first and the second optical paths that can modify optical characteristics of the light transmitted in one path and not interfere with the light transmitted along the other path.

There has thus been outlined, rather broadly, the more important features of the invention in order that the detailed description thereof that follows hereinafter may be better understood. Additional details and advantages of the invention will be set forth in the detailed description, and in part will be appreciated from the description, or may be learned by practice of the invention.

BRIEF DESCRIPTION OF THE DRAWINGS

In order to understand the invention and to see how it may be carried out in practice, embodiments will now be described, by way of non-limiting example only, with reference to the accompanying drawings, in which.

DETAILED DESCRIPTION OF EMBODIMENTS

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

In the drawings and descriptions set forth, identical reference numerals indicate those components that are common to different embodiments or configurations.

As used herein, the phrase "for example," "such as", "for instance" and variants thereof describe non-limiting embodiments of the presently disclosed subject matter. Reference in the specification to "one case", "some cases", "other cases" or variants thereof means that a particular feature, structure or characteristic described in connection with the embodiment(s) is included in at least one embodiment of the presently disclosed subject matter. Thus the appearance of the phrase "one case", "some cases", "other cases" or variants thereof does not necessarily refer to the same embodiment(s).

It is appreciated that certain features of the presently disclosed subject matter, which are, for clarity, described in the context of separate embodiments, may also be provided in combination in a single embodiment. Conversely, various features of the presently disclosed subject matter, which are, for brevity, described in the context of a single embodiment, may also be provided separately or in any suitable subcombination.

The new night imaging system of the present application may be implemented using a dedicated Readout Integrated Circuit (ROIC) configured for combining with a sensor array suitable for SWIR spectral range detection as discussed below. Especially, such imaging systems as discussed below may be used, for example, for night vision and/or night-time detection task. This may, for example, be achieved by using a matching spectral range (e.g., 1 μm -2.4 μm) sensor.

According to some embodiments, the proposed system utilizes wavelengths longer than 1.7 μm while keeping the detector's noise level below a usability threshold, thereby achieving performance better than in prior art systems.

Especially, using the techniques and structures disclosed below, the proposed system may achieve the capabilities of the prior art systems without significant cooling and with high imaging rate (e.g. hundreds of video frames per second).

According to some embodiments, the detection array may be implement as a structured P-i-N Super-lattice including multiple-quantum-well (MQW) photodiode (PD) pixels in a 2D focal plane array (FPA), operating near zero voltage bias. The detection array can be used to implement a dual-mode (reflective/thermal) night vision imaging means in one integrated instrument. Due to the dual-mode, the new night imaging system of the present application can feature as follows:

1. A radiative mode imaging means which can operate at room temperature for the detector and effectively image objects whose absolute temperature is larger than 20° C., in a scene with the temperature variations as low as 0.2° C. This feature can be achieved owing to the relatively low noise levels in the system with the noise equivalent temperature difference (NETD) less than 0.2° C.
2. A radiative mode imaging means which can operate using optics (lens) made of commercial polymer, crown and/or flint glass.
3. A radiative mode imaging means which can see through regular glass surfaces (e.g. windshields).
4. A radiative mode imaging which works at room temperature and has thermal time constant much shorter than 0.1 milliseconds (ms).
5. A combination of radiative and reflective type imaging means in a single device.
6. A combination of radiative and reflective type imaging means in a single device in which the relative effects of radiative and of reflective type images can be continuously changed.

Figure 1:
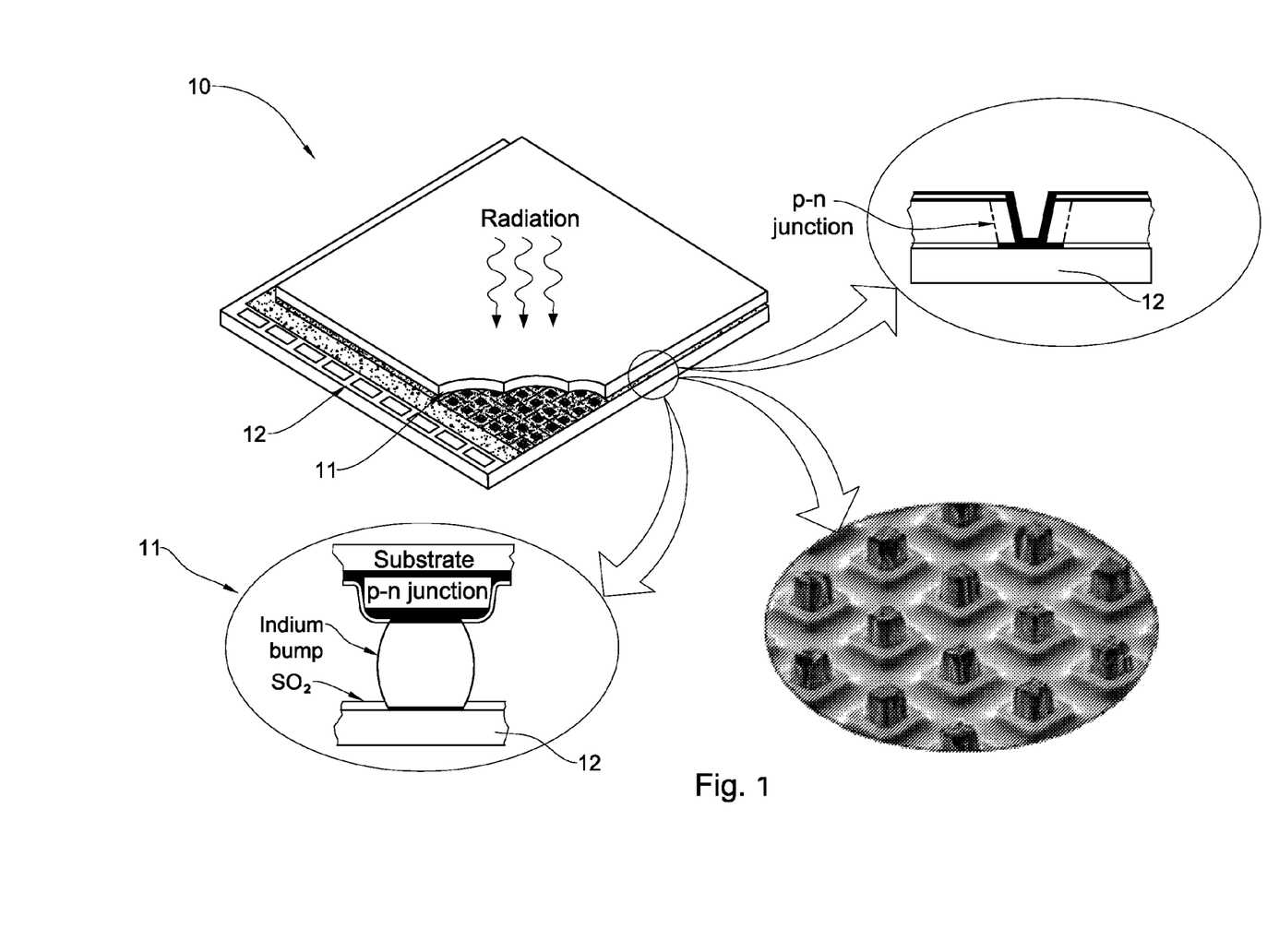
FIG. 1 is a schematic view of a two dimensional detection array, according to an embodiment of the invention.

FIG. 1 illustrates a schematic view of a two dimensional detection array 10, according to an embodiment of the invention. The detection array 10 may be implemented as a combination of a Focal Plane Array (FPA) 11 and Readout Integrated Circuit (ROIC) 12 that are interconnected using Flip-Chip-Bonding (FCB) with dedicated electronics (not shown). It will be understood that the implementation illustrated in FIG. 1 is exemplary, and other implementations are also contemplated.

Figure 2:
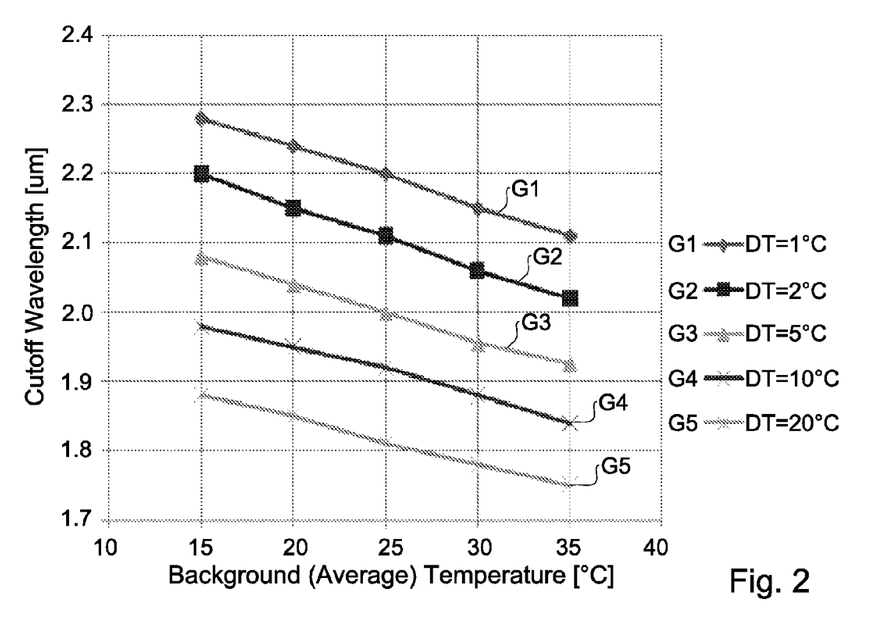
FIG. 2 shows examples of dependencies of a cutoff wavelength of a detector required in order to observe an object which is warmer than the background by the temperature DT versus the average background temperature.

Referring to FIG. 2, examples of dependencies of a cutoff wavelength required in order to observe an object which is warmer than the background by the temperature DT versus the average background temperature is shown. FIG. 2 corresponds to a SWIR thermal imaging means with a selectable cut-off wavelength in the range 1.7 μm-2.4 μm. Such range can, for example, be achieved by means of a variable spectral filter. According to these examples, the camera sensitivity was set to $2 \times 10^{-5}$ W/m$^2$ irradiance.

Specifically, FIG. 2 indicates the cutoff wavelength required for different average background temperature values (15° C., 20° C., . . . , 35° C.) in order to observe an object which is warmer (or colder) than the background by 1° C., 2° C., . . . , 20° C. In the figure, five graphs G1-G5 are shown corresponding to the cutoff wavelength dependency on the background temperature for different values of the temperature difference DT between the object and the background.

For example at a 25° C. background, an object warmer by 2° C. than the background would be observed by a camera with the cutoff wavelength of 2.1 μm (or longer), but not with the camera having the cut-off wavelength smaller than 2.1 μm.

Figure 3:
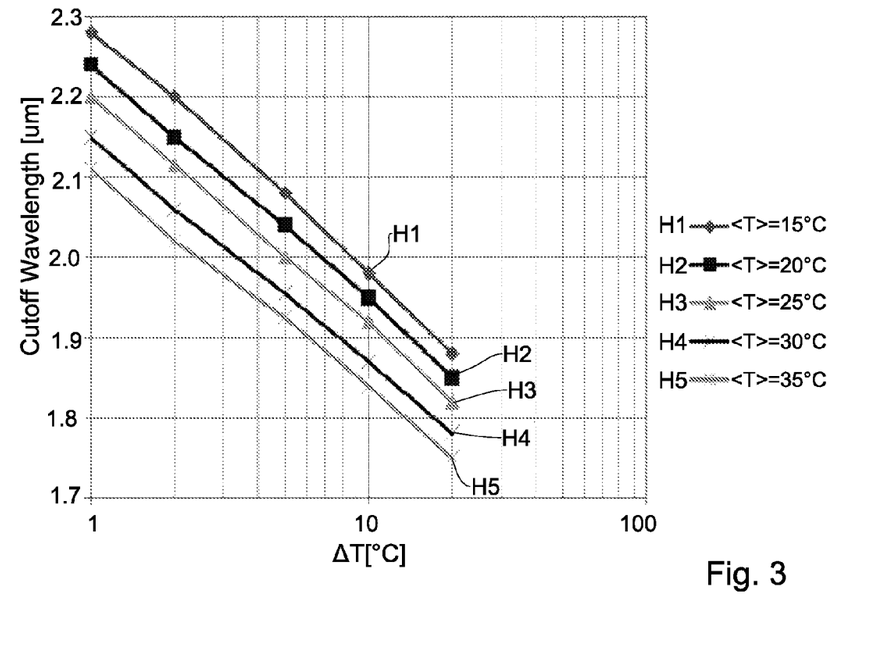
FIG. 3 shows examples of dependencies of cut-off wavelength of a detector as a function of the temperature difference between the object and background for various background temperatures.

FIG. 3 is a rearrangement of the data shown in FIG. 2. Six graphs are shown H1-H5 corresponding to the cutoff wavelength as a function of the temperature difference for different values of the background temperature. As illustrated in FIG. 3, a change in cut-off wavelength of 0.3 μm is roughly equivalent of changing the temperature difference between the object and background (i.e. temperature differential sensitivity) by a factor of 10.

Figure 4:
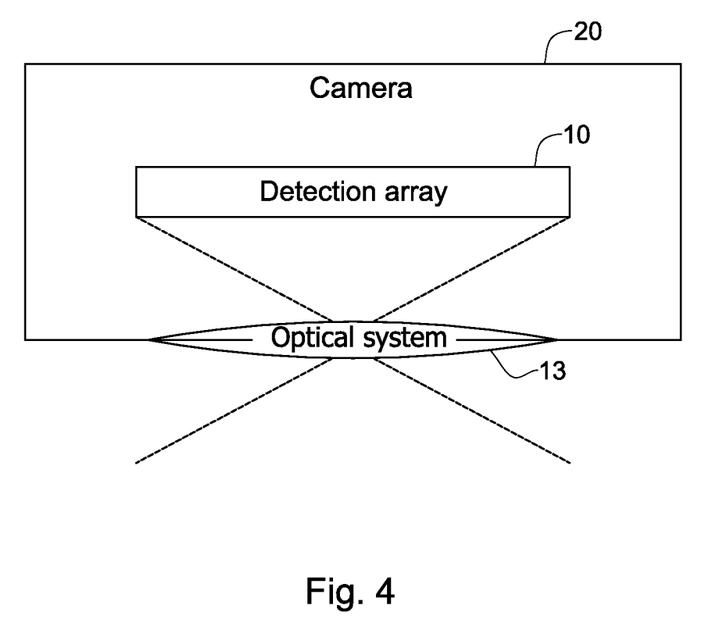
FIG. 4 shows a schematic view of a night vision system employing the two dimensional detection array shown in FIG. 1, according to an embodiment of the present application.

Referring to FIG. 4, a schematic view of a night vision system 20 employing the two dimensional detection array 10 shown in FIG. 1 is shown, according to an embodiment of the present application. Provided in the night vision system 20 is an optical system (e.g., a camera), which includes the detection array 10, and optical system 13 (e.g. lens) for directing light onto the detection array 10.

The detection array 10 can, for example, be based on a 2D FPA sensitive in a wavelength range which includes the wavelength longer than 1.7 μm, and preferably longer than 2 μm, even more preferably, up to 2.5 μm. By way of an example, the detection array 10 may be sensitive to light at the wavelengths in the range of 1 μm-2.4 μm.

According to some embodiments of the present application, the 2-dimensional detection array 10 may be implemented using Strained Super Lattice (SLS) techniques.

Figure 5:
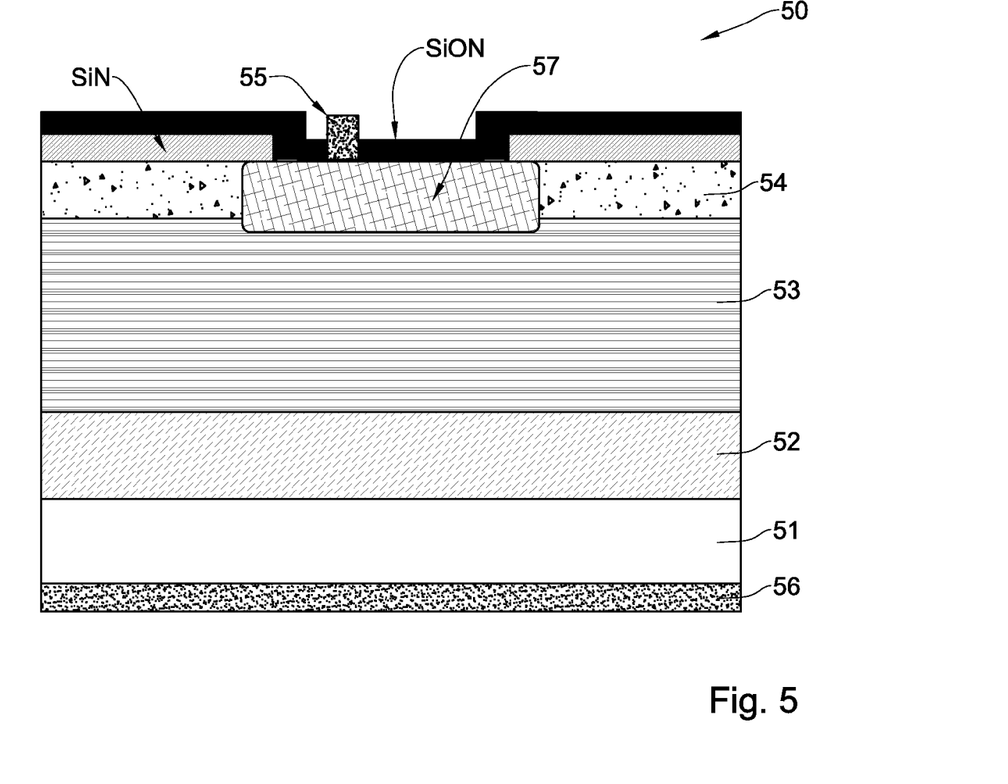
FIG. 5 is a schematic cross-sectional view of a photodetector included in the 2-dimensional detection array is shown in FIG. 1, according to one embodiment of the present invention.

Referring to FIGS. 1 and 5 together, a schematic cross-sectional view of a photodetector 50 included in the 2-dimensional detection array 10 is shown, according to one embodiment of the present invention. As shown in FIG. 5, each photodetector 50 of the detection array 10 includes a substrate InP layer 51 which supports a photodiode structure that includes an n-type layer 52, a p-type layer 54, and an absorption layer 53 which is sensitive to light, and which is located between the n and the p layers. Photons having suitable wavelength are absorbed in the absorber layer, and become pairs of electron-hole. According to an embodiment, the n-type layer 52 is Si-doped InGaAs buffer layer deposited on the S-doped InP substrate layer 51. The n-type layer 52 is undoped InGaAs cap layer, whereas the absorption layer 53 is undoped InGaAs. According to an embodiment, the absorption layers includes 250 pair InGaAs(5 nm)/GaAsSb(5 nm) multi quantum well structures.

The buffer layer, the absorption layer and the cap layer can, for example, be grown on the substrate by solid source molecular beam epitaxy (MBE) method.

A Zn doped region 57, forming a p-n junction, can be formed in p-type layer 54 in contact with the absorption layer 53 by the selective thermal diffusion of zinc. SiN and SiON (or $SiO_x$) can be used for passivation and anti-reflection, respectively. The photodiode also includes p-electrodes 55 and n-electrodes 56 formed in contact with the substrate InP layer 51 and the Zn doped region 57 in the absorption layer 53, respectively. According to another embodiment, the n-type electrode can also be formed by means of etching through the top layers 52, 53, 54 and forming an ohmic contact at the buffer layer which, in this case, is conductive.

The SLS absorption layer 53 (also termed absorber) of the photodetector 50 in the detection array 10 maintains high responsivity (A/W) and low dark current. It should be noted that the SLS absorption layer enable limiting the possibility of electrons to acquire Eg/2 energy (or more) and switching to conductivity (limiting possibly eliminating the Auger Recombination mechanism). It is further noted that the SLS absorption layer also increase the effectively felt mass of the electron (comparing to other solutions such as those discussed above), thus reducing the dark current.

Because of the relatively low dark currents that may be achieved according to the proposed implementation even in relatively high temperatures, the detection array 10 does not require significant cooling. Accordingly, the optical system (20 in FIG. 4) may or may not include a cooling sub-unit (not illustrated) for cooling at least the detection array 10. If the optical system 20 does include a cooling sub-system, it may be adapted to cool the detector array 10 (and possibly other components of the system 20) to a temperature that is higher than 250K, and possibly even higher (e.g. greater than 270K, or even greater than 280K).

Figure 6:
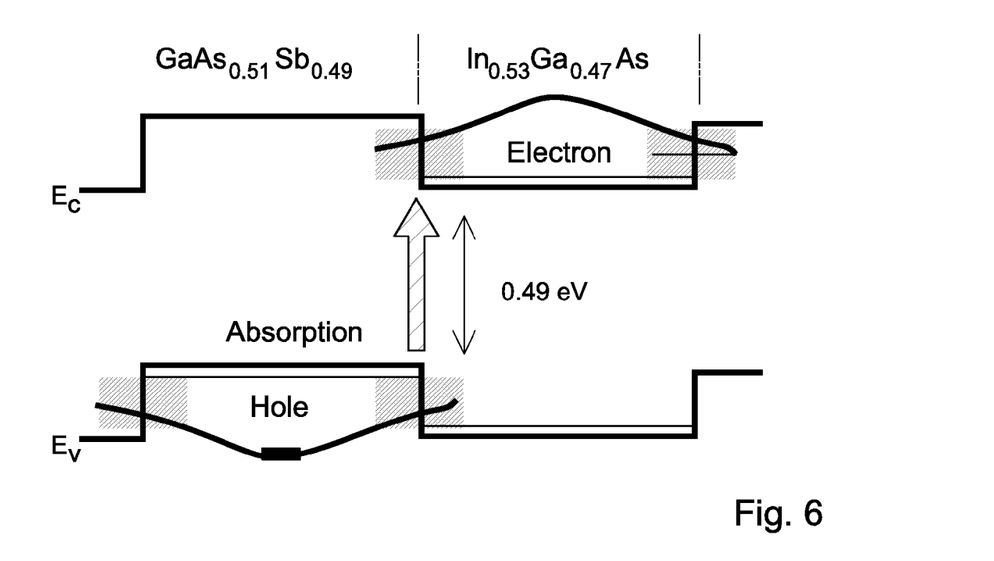
FIG. 6 shows characteristic SLS energy levels which may be implemented for the SLS absorption layer shown in FIG. 5, according to an embodiment of the invention.

FIG. 6 illustrates characteristic SLS energy levels which may be implemented for the SLS absorption layer (53 in FIG. 5), according to an embodiment of the invention.

According to an embodiment of the invention, optical system may include two or more detection arrays (10 in FIG. 1), e.g., two 640×512 pixels detection arrays that may be implemented on a wafer (e.g. a 2" diameter wafer), having pixel sizes of e.g. $(25 \mu m)^2$. Such a wafer, including one or more detection arrays 10, may be a result of growing of thin layers (Epitaxy) on an initial substrate of InP, or on a equivalent substrate. After the growing of the layers, the pixels and the electrical connection may be defined/generated using standard FAB process, e.g., to the result as illustrated in FIGS. 1 and 5.

It should be understood that the optical detection system (20 in FIG. 4) can be packaged in a metal sealed package, possibly having an inert atmosphere therein (e.g. argon gas or air/dry nitrogen), according to an embodiment of the invention.

Turning back to FIGS. 1 and 5, showing detection array 10 and the optical system 20 generally, the light passing through the optical components can reach the absorber layer 53 of each photodiode (pixel) through the InP substrate layer 51 (back-illumination), and an $I_{ph}$ photo current is created therein as a result of the absorbing of the photons. The current flows through the Flip Chip Bonded (FCB) connection to an electrical amplifier implemented in the Readout Integrated Circuit (ROIC) component, and charges a capacitor $C_f$ (having a characteristic capacity, e.g., of 10 fF) during a given time (e.g., $t_{int}$=10 mS). The charge collected in the capacitor changes the voltage across the capacitor at a rate of $I_{ph} \times (t_{int}/C_f)$. This voltage change for each pixels is read for all the pixels of the detection array 10 (possibly concurrently), is multiplexed, and therefrom it is transferred to the ROIC output. From this signal, a video signal may be created.

According to an embodiment, the SLS absorption layer 53, may, for example, be fabricated as a type-2 super lattice layer (SL2). The fabrication of the detection array (or at least part of it) may include fabrication of wafer of the SL2 epitaxial grown layers (FPA), e.g. according to table 1, that illustrates one non-limiting example of the layout of the photodetector of the present application.

TABLE 1

| Purpose | Thickness (nm) | Material | Type | Doping density (cm$^{-3}$) |
|---|---|---|---|---|
| Contact | 20 | $In_{0.53}Ga_{0.47}As$ | p$^+$ | $10^{19}$ |
| Cladding | 500 | $In_{0.53}Ga_{0.47}As$ | p$^+$ | $2 \times 10^{18}$ |
|  | 45 | $In_{0.53}Ga_{0.47}As$ | i | — |
| Absorber | 1500 | 5 mm $In_{0.53}Ga_{0.47}As$/ 5 mm $GaAs_{0.51}Sb_{0.40}$ | i | — |
|  | 50 | $In_{0.53}Ga_{0.47}As$ | i | — |
| Grading | 50 | InAlGaAs (1 eV) | i | — |
| Charge sheet | 110 | $In_{0.52}Al_{0.48}As$ | p | $3 \times 10^{17}$ |
| Multiplication | 1000 | $In_{0.52}Al_{0.48}As$ | i | — |
| Cladding | 500 | $In_{0.53}Al_{0.47}As$ | n$^+$ | $2 \times 10^{18}$ |
| Substrate | — | InP | n$^+$ | — |

According to the example shown in Table 1, the superlattice contains three superlattice layers grown on the InP substrate layer (SL1: 500 periods of $In_{0.53}Al_{0.47}As$ forming the cladding, 1500 periods of $In_{0.52}Al_{0.48}As$ forming the multiplication, 110 periods of $In_{0.52}Al_{0.48}As$ forming the charging sheet, 50 periods of InAlGaAs forming the grading; SL2: 50 periods of $In_{0.53}Ga_{0.47}As$ and 1500 periods of 5 mm $In_{0.53}Ga_{0.47}As$/5 mm $GaAs_{0.51}Sb_{0.40}$ forming the absorber; SL3: 45 periods of $In_{0.53}Ga_{0.47}As$ and 500 periods of $In_{0.53}Ga_{0.47}As$ forming the cladding and 20 periods of $In_{0.53}Ga_{0.47}As$ forming the contact.

According to an embodiment of the invention, when the device is operated as a PiN PV photo-diode, rather than as Avalanche Diode (APD) Detectors, the Multiplication layer may be reduced to less than 100 nm in thickness.

According to an embodiment of the invention, the isolated pixels may be formed by means of H+ ion implantation into a depth of 2100 nm, through a mask with 0.1 μm width.

It should be noted that generally different methods and techniques may be implemented for the reduction of dark current. Such methods may include, for example, W-Structured Super-Lattice, that may include Introduction of a four constituent InAs/GaInSb/InAs/AlGaInSb "W"-structured super-lattice (WSL) absorber region that provides quasi-two dimensional densities of states for both carrier types. This enhances the absorption turn on near the band edge.

According to an embodiment of the invention, generating of the detection array 10 may include grading of the band gap in the depletion region. The primary effect of the grading is to suppress tunneling and generation-recombination (G-R) currents in the depletion region at low temperatures. Since both these processes depend exponentially on band gap, a wide gap material may be substituted into most of the depletion region.

Figure 7A:
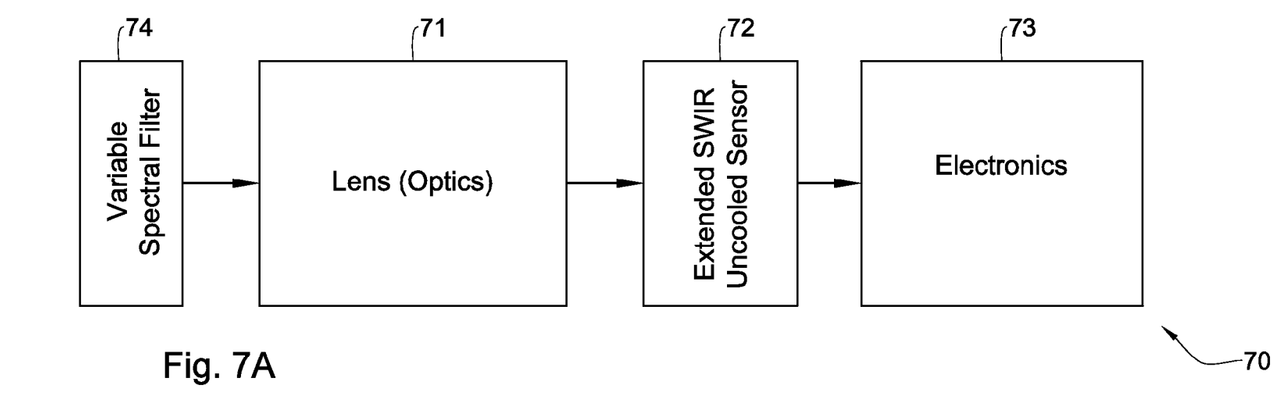
FIGS. 7A and 7B show schematic views of a night vision system, according to two embodiments of the invention.
Figure 7B:
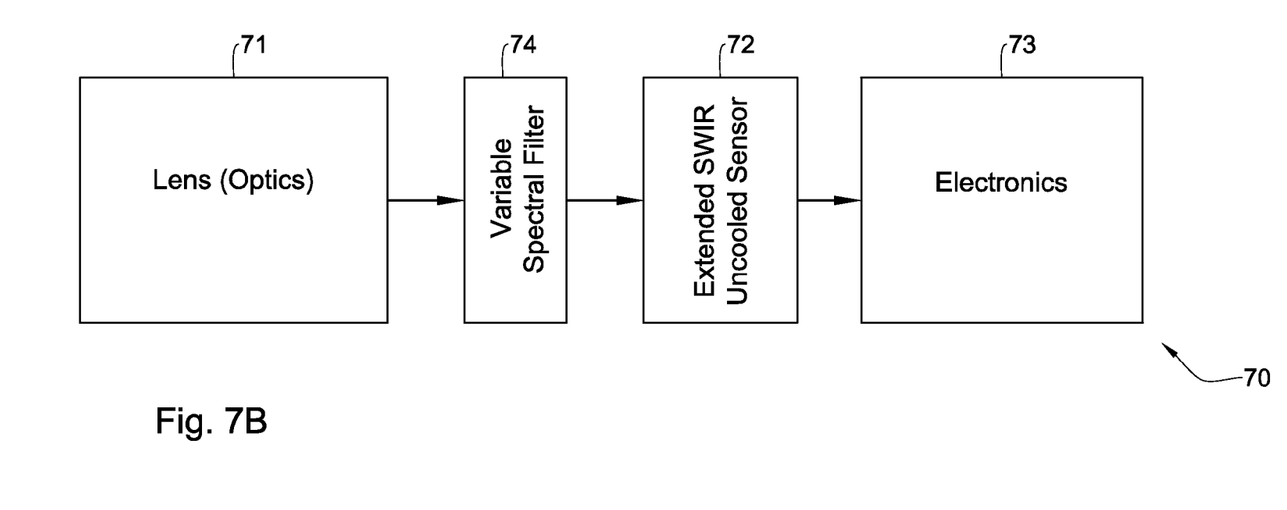

Referring to FIGS. 7A and 7B, schematic views of a night vision system 70 are shown, according to two embodiments of the invention. The night vision system 70 includes an optical system 71 for collecting light and focusing collected light onto a photodetector 72 associated with a dedicated electronics 73.

According to one embodiment, the photodetector 72 is an extended SWIR sensor has a p-i-n structure with a super lattice having layout as described and shown above in FIG. 5.

According to another embodiment, the photodetector 72 is an extended SWIR sensor has a p-i-n structure with a super lattice having layout as described above and shown in table 1.

The photodetector 72 has a cut-off wavelength of about 2.4-2.5 microns under near room temperature conditions. Accordingly, the night vision system 70 is therefore capable of detecting light reflected from and emitted by an object being imaged.

Due to the employing the photodetector 72, the noise level of the system is low enough, so as the system can be sensitive to the thermal radiation emitted from the object being imaged within the wavelength range of the device even in the absence of any light reflections. According to the embodiments show in FIGS. 7A and 7B, the night vision system 70 includes a spectral filter 74 located in an optical path of light propagating to the detector. FIG. 7A shows the configuration in which the spectral filter 74 is arranged upstream of the optical system 71, whereas FIG. 7B shows the configuration in which the spectral filter 74 is arranged downstream of the optical system 71.

According to an embodiment of the present application, the spectral filter 74 is configured and operable to selectively filter out light of wavelength shorter than about 1.8 μm (microns) thereby can shift the system operation from "mostly reflection" mode to a combined "reflection plus thermal" mode. The reflection mode utilizes the light emitted by a natural or environmental source such as the moon, starlight, airglow or zodiacal light or ambient artificial (e.g. urban) light, and reflected off the surface of the imaged objects and their background. On the other hand, the thermal (or "radiative") mode utilizes optical radiance emitted by the imaged objects themselves and also emitted by the background around the objects.

The spectral filter 74 can be made as a "gradual" or variable spectral filter (SVF) such that the relative contribution of "reflected of" and "emitted by" radiance from the imaged object can be controlled, thereby allowing for an indication of imaged object surface attributes, such as its temperature and its reflectivity or emissivity.

In operation, the spectral filter 74 sets the long wavelength cut-off of the imager, and hence its imaging mode (thermal, reflective and a combination of the two).

According to some embodiments, the filter can be implemented with glass-type materials (e.g. Crown glass, Flint glass and/or other types of glasses) that are only transparent up to a wavelength of 2.7 μm or less.

According to some embodiments, the filter can be thermally active with the emissivity $\epsilon$ which may be significantly higher than what is allowed in thermal imaging systems (e.g. $\epsilon_{18}$ 0.1 and more), as long as the filter temperature is less than 40° C. This feature is especially important in order to allow a user to hold it with bare hands). The thermal emission of the filter will still be negligible and will not affect the performance of the imager.

The cut-off wavelength can be selected either manually or by means of a mechanical servo/step/engine, changing the location of the filter with respect to the optics.

The spectral variable filter (SVF) can be implemented as follows:

1. Linear Variable Filter (LVF)
    a. The stack of thin films which form the spectral filter is gradually changing along a linear dimension of the filter such that the long wavelength cut-off of the filter changes along this linear dimension.
    b. The long wavelength cut-off should change at least in the range of 1700 nm to 2500 nm. An example of a similar filter, implemented by Reynard Corp. (USA) is LVF P/N R04610-00.
2. Circular Variable Filter (CVF)
    a. Same as LVF, but with the long wavelength cut-off changing along the perimeter of a circle shape filter.
    b. An example of a similar filter is described in the following publication which is incorporated herein in its entirety: S. P. Morozova, P. A. Morozov, V. I. Sapritsky, B. E. Lisiansky, and N. L. Dovgilov , "VNI-IOFI Spectroradiometer Based on a Circular Variable Filter for the Spectral Range from 2.5 μm up to 14 μm", AIP Conf. Proc.—Sep. 29, 2003—Volume 684, pp. 595-600 TEMPERATURE: Its Measurement and Control in Science and Industry; Volume VII; Eighth Temperature Symposium; 29 Sep. 2003
3. Circular and/or Linear Step-Variable Filter
    a. Same as LVF or CVF, but with the change in long wavelength cutoff implemented in discrete steps along the linear-dimension (as in LVF) or the perimeter of a circle (as in CVF).
    b. An example of a similar filter, built by Reynard Corp. is their P/N R00160-30 with 11 discrete steps along a linear dimension, or P/N R02835-00 with 11 discrete steps along an angular dimension In operation, the optical system 71 forms an image of the viewed imagery at the faceplate of the photodetector 72. According to an embodiment of the application, the optical system 71 includes one or more lenses (not shown) implemented with glass-type materials that are only transparent up to a wavelength of 2.7 um or less. Examples of the glasses suitable for the lenses include, but are not limited to, BK7 glass, Flint glasses and other glass types. Yet another important aspect of this design is that the optical system 71 can be thermally active, with an emissivity which may be significantly higher than the emissivity that is allowed in thermal imaging systems (e.g., $\epsilon\_0.1$ and more) as long as the filter temperature is less than 40° C. (Which is required anyhow in order to allow a user to hold it with bare hands). The thermal emission of the lens will still be negligible and will not affect the performance of the night vision system 70.

According to an embodiment of the present application, the optical system has a first optical path through which a first wavelength light generated by a thermal source is transmitted, and a second optical path through which a second wavelength environmental light reflected from objects is transmitted. The optical system employs the corresponding lens located in the first and second optical paths enabling the optical system to modify optical characteristics of the light transmitted through the first and second paths such that the light transmitted through the first path do not interfere with light transmitted through the second paths. This can, for example, be accomplished by means of a dichroic mirror or by a spectral beam splitter, which are both available as commercial components.

The electronics 73 is configured to perform, among others, the following functions:
1. Amplify the signal from each pixel of the SWIR sensor.
2. Multiplex the signals from all pixels and read them in a raster manner to form a video signal.
3. Form a video signal which can be read by computer, TV-monitor or any other type of display, or stored in a computer digital media.

In clear sky moonless nights, the natural ambient light illumination in the 0.951 μm-1.7 um band (SWIR-1) is in the range of 30±7 nW/cm$^2$. It is believed that at 30 nW/cm$^2$, the system of the present application with a dark current of 2 nA/cm$^2$, 251 μm size pixels and 1 A/W responsivity (at 1.6 um wavelength) is capable of providing enough contrast for night vision.

In the thermal (radiative mode) it has been established that an NETD of about 0.2K can be sufficient for acceptable viewing conditions.

It was found by the inventors that for the system of the present application operating at the 0.96-2.4 μm band, 25 μm square pixels, 1.1 A/W average responsivity, 20° C. sensor temperature, and 40 nA/cm$^2$ dark current, the NETD meets the requirements above, and for background BB temperatures is in the range of 0° C. to +40° C.

It is believed by the inventors that 40 nA/cm$^2$ (and even 80 nA/cm$^2$ at higher BB temperature) is an appropriate dark current selection. If 2 nA/cm$^2$ would be possible with such an imaging means, the reflective mode discussed above shall be enabled and co-operate with the thermal (radiative) mode. In such a case—background limited infrared performance (BLIP) performance will be approached.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

It will be appreciated that the embodiments described above are cited by way of example, and various features thereof and combinations of these features can be varied and modified.

While various embodiments have been shown and described, it will be understood that there is no intent to limit the invention by such disclosure, but rather, it is intended to cover all modifications and alternate constructions falling within the scope of the invention, as defined in the appended claims.

The invention claimed is:

1. A night vision system for imaging an object, the system being configured for operating at or near room temperature and in the wavelength region up to 2.5 microns, the system comprising:
   a photodetector having a cut-off wavelength of up to 2.5 microns under said room temperature, and sensitive to both reflective radiation and thermal radiation emitted from the object;
   an optical system configured for collecting light and focusing the collected light onto the photodetector; and
   a controllably variable spectral filter located in an optical path of light propagating toward the photodetector, wherein said controllably variable spectral filter has a cut-off wavelength changing along at least one dimension of the filter, said cut-off wavelength changing including at least one of gradual changing and changing in discrete steps), said controllably variable filter being thereby configured and operable to controllably vary the cut-off wavelength thereof to selectively filter out light of wavelengths shorter than a predetermined value, at which the reflective radiation being dominant over the thermal radiation, thereby gradually shifting so as to shift operation of the night vision system from mostly reflection mode to a combined reflection and thermal mode, thereby to allow the night vision system to detect light reflected from and emitted by the object being imaged.

2. The night vision system of claim 1, wherein the photodetector is an extended SWIR sensor having a p-i-n structure.

3. The night vision system of claim 1, wherein the photodetector is a detection array comprising a doped InP substrate layer and a photodiode structure supported by the substrate InP layer, said photodiode structure comprising an n-type layer, a p-type layer, and an absorption layer being sensitive to light, and located between the n and the p layers.

4. The night vision system of claim 3, wherein the n-type layer is Si-doped InGaAs buffer layer deposited on the InP substrate layer; wherein the n-type layer is undoped InGaAs cap layer; and wherein the absorption layer is undoped InGaAs.

5. The night vision system of claim 3, wherein the absorption layers is a Strained Super Lattice (SLS) layer including 250 pair InGaAs(5 nm)/GaAsSb(5 nm) multi quantum well structures.

6. The night vision system of claim 3, wherein the absorption layers is a Strained Super Lattice (SLS) layer including three superlattice layers SL1, SL2 and SL3 grown on the InP substrate layer, wherein the SL1 superlattice layer includes: 500 periods of $In_{0.53}Al_{0.47}As$ forming the cladding, 1500 periods of $In_{0.52}Al_{0.48}As$ forming the multiplication, 110 periods of $In_{0.52}Al_{0.48}As$ forming the charging sheet, 50 periods of InAlGaAs forming the grading; the SL2 superlattice layer includes: 50 periods of $In_{0.53}Ga_{0.47}As$ and 1500 periods of 5 mm $In_{0.53}Ga_{.047}As$/5 mm $GaAs_{0.51}Sb_{0.40}$ forming the absorber; and the SL3 superlattice layer includes: 45 periods of $In_{0.53}Ga_{0.47}As$ and 500 periods of $In_{0.53}Ga_{0.47}As$ forming the cladding and 20 periods of $In_{0.53}Ga_{0.47}As$ forming a contact.

7. The night vision system of claim 1, wherein the spectral filter is arranged upstream of the optical system.

8. The night vision system of claim 1, wherein the spectral filter is arranged downstream of the optical system.

9. The night vision system of claim 1, wherein said spectral filter is configured and operable to selectively filter out light of wavelengths predetermined value of the light wavelength shorter than which is filter out is about 1.8 microns.

10. The night vision system of claim 1, wherein the optical system has a first optical path through which a first wavelength band light generated by a thermal source is transmitted, and a second optical path through which a second wavelength band environmental light reflected from objects is transmitted, wherein the optical system is configured to modify optical characteristics of the light transmitted through the first and second paths such that the light transmitted through the first path do not interfere with light transmitted through the second paths.

11. The night vision system of claim 3, wherein the absorption layers is a Strained Super Lattice (SLS) layer including multiple pair InGaAs(5 nm)/GaAsSb(5 nm) quantum well structures.

12. The night vision system of claim 3, wherein the absorption layers is a Strained Super Lattice (SLS) layer including three superlattice layers SL1, SL2 and SL3 grown on the InP substrate layer, wherein the SL1 superlattice layer includes: multiple periods of $In_{0.53}Al_{0.47}As$ forming the cladding, multiple periods of $In_{0.52}Al_{0.48}As$ forming the multiplication, multiple periods of $In_{0.52}Al_{0.48}As$ forming the charging sheet, multiple periods of InAlGaAs forming the grading; the SL2 superlattice layer includes: multiple periods of $In_{0.53}Ga_{0.47}As$ and multiple periods of 5 mm $In_{0.53}Ga_{0.47}As$/5 mm $GaAs_{0.53}Sb_{0.40}$ forming the absorber; and the SL3 superlattice layer includes: multiple periods of $In_{0.53}Ga_{0.47}As$ and multiple periods of $In_{0.53}Ga_{0.47}As$ forming the cladding and multiple periods of $In_{0.53}Ga_{0.47}As$ forming a contact.

13. The night vision system of claim 1, wherein said spectral variable filter is a linear variable filter having the wavelength cut-off gradually changing along a linear dimension of the filter.

14. The night vision system of claim 13, wherein said spectral variable filter is configured as a stack of thin films.

15. The night vision system of claim 1, wherein said spectral variable filter has long wavelength cut-off at least in the range of 1700 nm to 2500 nm.

16. The night vision system of claim 1, wherein said spectral variable filter is configured as a circular variable filter having the wavelength cut-off gradually changing along a perimeter of a circle shape.

17. The night vision system of claim 1, wherein said spectral variable filter is configured such that the wavelength cutoff is changing in the discrete steps along at least one of a linear dimension of the filter and a perimeter of a circle shape of the filter.

18. A method for imaging an object at or near room temperature and operating in the wavelength region up to 2.5 microns, the method comprising:
   collecting light and focusing the collected light by an optical system onto a photodetector having a cut-off wavelength of up to 2.5 microns under said room temperature and sensitive to both reflective radiation and thermal radiation emitted from the object; and
   selectively filtering out light of wavelengths at which the reflective radiation being dominant over the thermal radiation, by operating a controllably variable spectral filter, having a cut-off wavelength changing along at least one dimension of the filter, shorter than a predetermined value, thereby gradually shifting so as to shift imaging from mostly reflection mode to a combined reflection and thermal mode, thereby to allow detecting light reflected from and emitted by the object being imaged.

19. The method of claim 18, wherein the light which is filtered out has said predetermined value of the light wavelength shorter than the wavelength which is filtered out is about 1.8 microns.

20. The method of claim 18, wherein in the dark current of the photodetector is lower than 40 nA/cm$^2$.

21. The method of claim 18, wherein the photodetector operates at temperatures higher than 270K.

22. The method of claim 18, utilized for detecting firing or firearms.

* * * * *